(12) United States Patent
Ohannaidh

(10) Patent No.: US 7,760,014 B2
(45) Date of Patent: Jul. 20, 2010

(54) LOWPASS BIQUAD VGA FILTER

(75) Inventor: Eoin Ohannaidh, Laval (FR)

(73) Assignee: STMicroelectronics SA, Montrouge (FR)

( * ) Notice: Subject to any disclaimer, the term of this patent is extended or adjusted under 35 U.S.C. 154(b) by 430 days.

(21) Appl. No.: 11/652,386

(22) Filed: Jan. 10, 2007

(65) Prior Publication Data

US 2007/0159240 A1   Jul. 12, 2007

(30) Foreign Application Priority Data

Jan. 11, 2006   (EP)   ................................. 06290074

(51) Int. Cl.
*H04B 1/10* (2006.01)
(52) U.S. Cl. .................................... 327/558
(58) Field of Classification Search ........................ None
See application file for complete search history.

(56) References Cited

U.S. PATENT DOCUMENTS

| 4,524,332 | A |   | 6/1985  | Gay |
| 4,877,979 | A | * | 10/1989 | Sempel ........................ 327/555 |
| 5,418,492 | A |   | 5/1995  | Wang et al. |
| 5,719,529 | A | * | 2/1998  | Kawahara et al. ............ 330/253 |
| 6,239,653 | B1 | * | 5/2001  | Rezzi et al. .................. 327/552 |
| 6,268,765 | B1 |   | 7/2001  | Gopinathan et al. |
| 2003/0132797 | A1 | * | 7/2003 | Mohieldin et al. .......... 327/552 |

FOREIGN PATENT DOCUMENTS

EP   1326336 A2   7/2003

OTHER PUBLICATIONS

Shi, C., et al., "A Novel Low-Power High-Linearity CMOS Filter," Proceedings of the 43rd IEEE Midwest Symposium on Circuits and Systems, Piscataway, New Jersey, Aug. 8-11, 2000, pp. 204-207.
Deng, Y., et al., "Design of a 1V 250MHZ Current-Mode Filter in Conventional CMOS Process," Proceedings of the 2001 IEEE International Symposium on Circuits and Systems, Sydney, Australia, May 6-9, 2001, pp. I236-I239.

* cited by examiner

*Primary Examiner*—Lincoln Donovan
*Assistant Examiner*—Khareem E Almo
(74) *Attorney, Agent, or Firm*—Lisa K. Jorgenson; Thomas J. Satagaj; Seed IP Law Group PLLC

(57) ABSTRACT

A biquad gain stage, as well as a Variable Gain Amplifier is disclosed. The biquad gain stage comprises a plurality of transistors as well as conductances, and capacitances, as well as current sources. The resulting variable gain amplifier comprising a plurality of biquad gain stage cascaded in series allows to filter large unwanted blockers and to amplify a small wide-band signal. Both the gain and the filtering are distributed along a signal chain comprising a series of low-noise, high-Q biquad gain stages, each with limited current consumption and low component ratios.

31 Claims, 7 Drawing Sheets

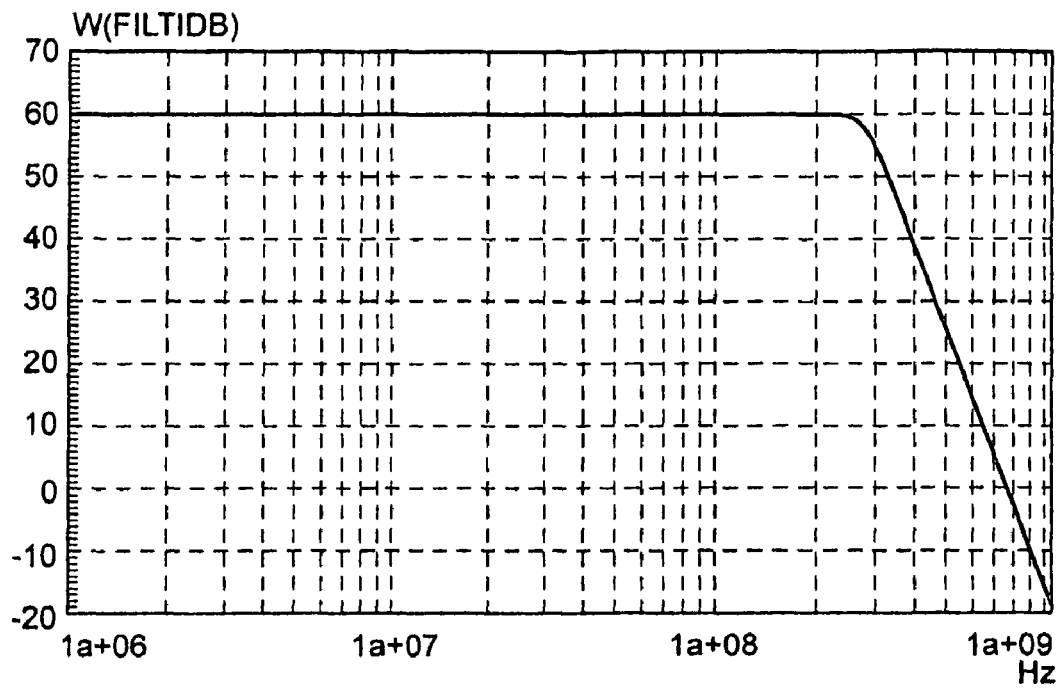
FIG. 8.1
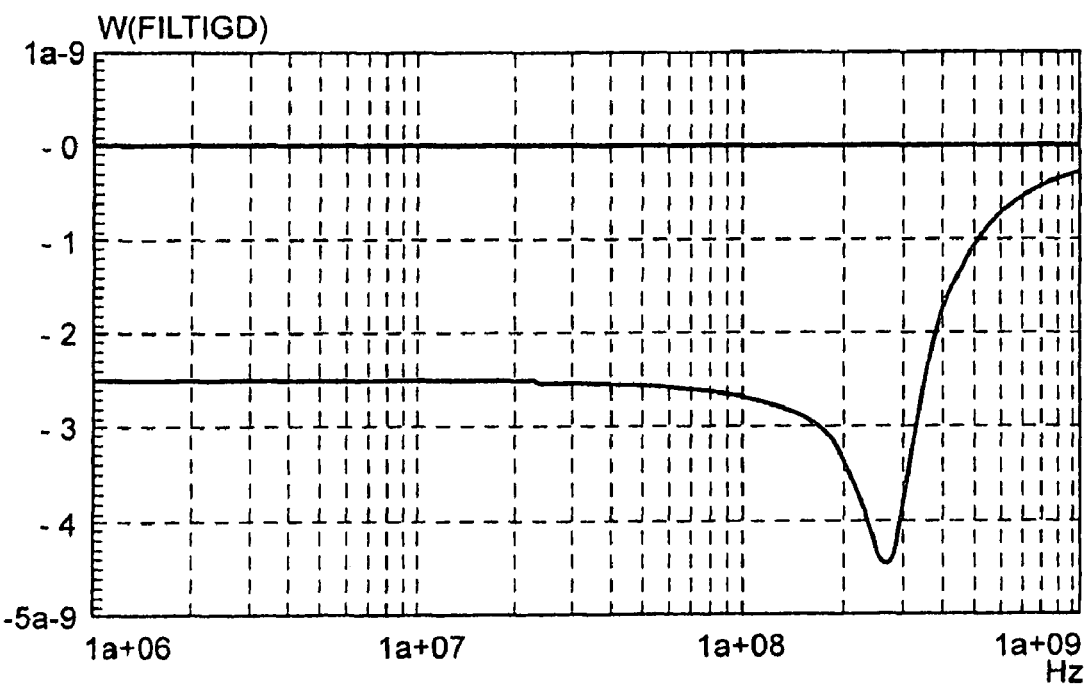
FIG. 8.2

LOWPASS BIQUAD VGA FILTER

BACKGROUND OF THE INVENTION

1. Field of the Invention

The present invention relates generally to electrical VGA filters and in particular to lowpass biquad VGA filters.

2. Description of the Related Art

A lowpass filter is a filter for attenuating or damping the frequency band beyond a given frequency, also called the filter cutoff frequency. Thus the amplitude response of a lowpass filter is different for frequencies either above or below the filter cutoff frequency.

Lowpass filters, such as Butterworth, Chebychev or Bessel filters, have been used for years in the processing of signals in a reverberant or high clutter background. These high order filters often present poles only and often consist of several cascaded biquad filters, or biquads. A biquad filter is generally a filter with a two pole and two zero filter topology, i.e., with a second order transfer function in the s-domain both in the numerator and denominator. The poles and zeroes are directly linked to the elimination capacities of the biquad filter.

Another type of circuit commonly used in analog signal chains is the Variable Gain Amplifier (VGA). This circuit's function is to amplify a signal in order to drive an Analog to Digital Converter (ADC) with a constant signal magnitude as close as possible to its full swing capacity.

In a typical analog signal chain, a VGA is placed in series with a lowpass filter, however a problem arises in the analog base-band of emerging communications applications where a VGA function is required to amplify a small wide-band signal and a lowpass filter function is required to filter large unwanted blockers. An architecture consisting of first filtering the blockers and then amplifying the signal would have the advantage of avoiding non-linearity problems associated with amplifying blockers, but this architecture would suffer from the noise constraints placed upon the filter. On the other hand, an architecture consisting of first amplifying the signal and then filtering the blockers would have the advantage of an increased signal to noise ratio (SNR), but would place very difficult non-linearity constraints on the filter.

Consequently, there is a need for a new VGA filter architecture that integrates together filtering and gain, and that does not display the above mentioned drawbacks from known architectures involving separate VGA and filter functions.

BRIEF SUMMARY OF THE INVENTION

One embodiment of the present invention allows these two main functions of a VGA filter without being detrimental to the noise performance or to the linearity of the filter.

According to one embodiment of the present invention a biquad filter has a simple layout, namely with only a few transistors. Therefore such a biquad filter exhibits less current consumption. Furthermore, a low-noise, high Q biquad gain stage is achieved that allows much noise reduction while still minimizing the non-linearity problems at the same time.

As the biquad filter according to embodiments of the invention can amplify an input signal, it will also be referred to, here after, as a biquad gain stage or biquad filter gain stage.

The circuit architecture of the proposed biquad filter is based on a well known Sallen-Key biquad circuit, the follower current of which is added to a second current, also derived from the Sallen-Key circuit, to realize the biquad filter transfer function.

Another embodiment of the present invention relates to a lowpass filter using a plurality of biquad filters, all connected in series and powered by the same voltage supply.

A $2N^{th}$ order lowpass filter (N being a non nil integer), for example a Butterworth filter, is made of 2N poles. All 2N poles have the same magnitude, but present different angles $\theta$, and thus different values of tan $\theta$. However the 2N poles are actually made up of N pole-pairs, known as complex conjugate pairs. The purpose of the biquad filter is to provide a single pole-pair (thus two poles). Thus, to build a $2N^{th}$ order Butterworth filter, N cascading biquad filters are needed, each providing two poles, or a complex conjugate pole-pair.

As the order of the filter increases, more biquad filters are required, and the tan $\theta$ (or Q factor) values of the last biquad filter gets higher. The Q factor of a biquad is related to the tangent of the biquad pole position (tan $\theta$) by the equation: $\tan \theta = \sqrt{4Q^2 - 1}$. Q factor and tan $\theta$ are two ways of indicating the pole positions of a biquad filter. The higher their value is, the harder the circuit is to design. A large tan $\theta$ value can be problematic, as the ratio of component values is often related to $\tan^2 \theta$.

Furthermore, a given number of N structures in parallel will produce $\sqrt{N}$ times less noise relative to the input signal. Said structures, when connected in parallel between the power supply terminals, will consume N times more current. It is therefore important that the elementary differential biquad filter structure consumes as little current as possible.

Thanks to some embodiments of the VGA filter of the invention, both the gain and the filtering are distributed along a signal chain comprising a series of low-noise, high-Q biquad gain stages according to some embodiments of the invention, each with limited current consumption.

BRIEF DESCRIPTION OF THE SEVERAL VIEWS OF THE DRAWINGS

The features of the present invention will become more apparent from the consideration of the following detailed description of exemplary, non-limiting embodiments taken in conjunction with the accompanying drawings, in which:

FIGS. 8.1 and 8.2 are diagrams showing the gain and frequency response respectively of an application of the Variable Gain Amplifier Filter comprising a mixer gain stage, 3 biquad gain stages (as shown in FIG. 7), and a pure gain stage (as shown in FIG. 7 but with all capacitors removed and with conductances g2 shorted).

On the different figures, the same elements carry the same reference numbers.

DETAILED DESCRIPTION OF THE INVENTION

Figure 1:
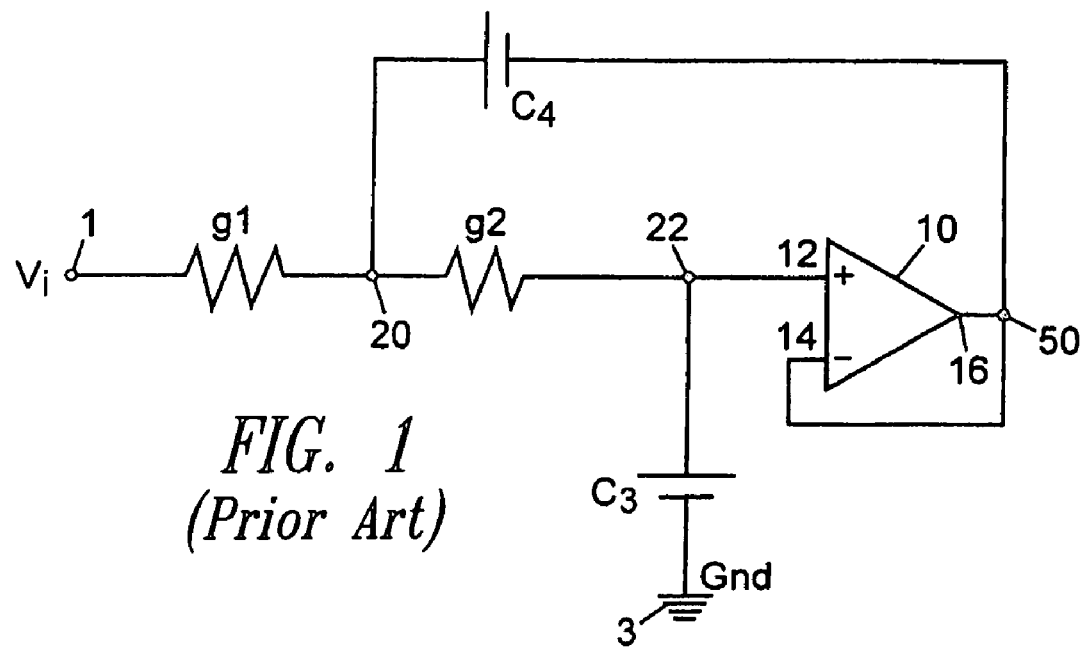
FIG. 1 is a schematic circuit diagram of a conventional Sallen-Key filter circuit.

FIG. 1 illustrates a typical Sallen-Key filter circuit. The circuit comprises an operational amplifier 10 connected in unity gain. It has positive and negative input terminals 12,14 and an output terminal 16 connected to the negative input 14. First and second conductance g1 and g2 are connected in series between the input Vi of the circuit and the positive input terminal 12 of the amplifier 10. A first capacitance C3 is connected between one terminal 22 of the second conductance g2 and the ground 3, or any AC ground node for that matter. A second capacitance C4 is connected between a junction 20 between the two first conductances and the output terminal 16 of the amplifier. Naming V22 the output signal on node 22 of FIG. 1 and Vi the input signal on node 1, the Sallen-Key filter circuit yields the following relationship (1.1):

$$\frac{V_{22}}{V_i} = \frac{g_1 g_2}{g_1 g_2 + sC_3(g_1 + g_2) + s^2 C_3 C_4} \quad (1)$$

using the classic complex variable approach with Y=g+sC, where Y is any admittance, g is a conductance, C is a capacitance, and s=jω with ω as the frequency.

The main advantage of the Sallen-Key architecture is the simplicity of its implementation.

Figure 2:
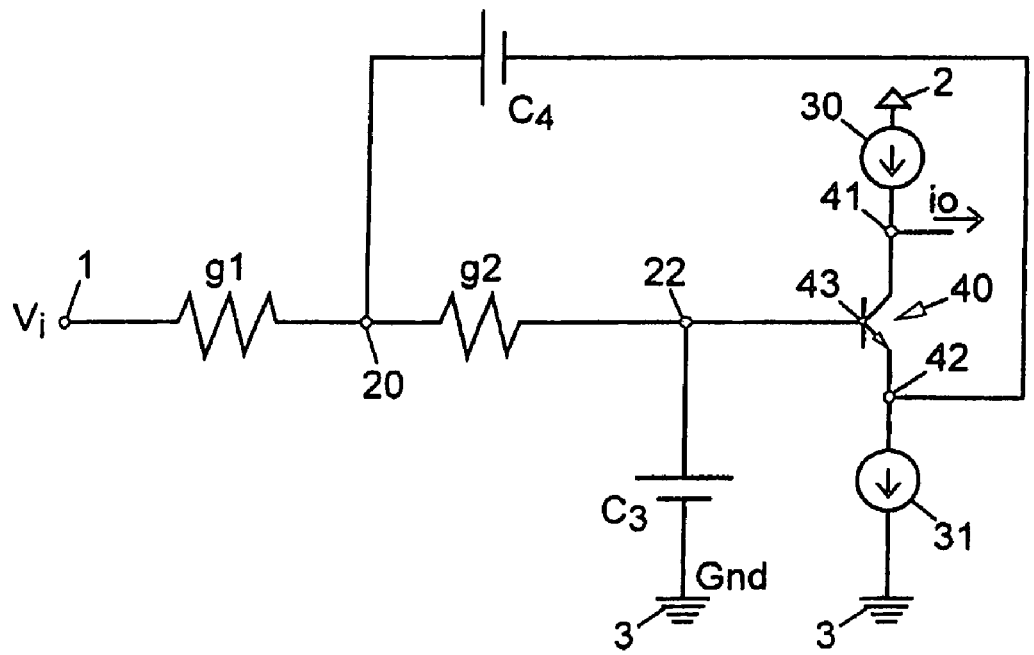
FIG. 2 is a schematic circuit diagram of a modified Sallen-Key filter circuit.

The Amp-Op in unity gain arrangement can be replaced by a follower transistor, as shown in FIG. 2. In this figure, the Amp-Op 10 of FIG. 1 is replaced by a follower transistor 40 between the capacitance C4 and node 22. The follower transistor comprises two main terminals 41 and 42 and one control terminal 43. Capacitance C4 is connected to the second main terminal 42 of the follower transistor. Two current sources 30 and 31 have been added. The first one 30 is connected between a first power supply terminal 2 and the first main terminal 41 of the follower transistor, while the second one 31 is connected between the second main terminal 42 of the follower transistor and a second power supply terminal, here the ground 3. Both current sources could deliver the same current, though they could also be used to correct direct current (DC) offsets at the biquad output.

The follower transistor itself can be a MOS transistor, either of the NMOS or PMOS type. It could also be an NPN transistor. In the examples shown hereafter, the follower transistor 40 is an NMOS transistor. Thus the control terminal 43 of the NMOS transistor is the gate, its first main terminal 41 is the drain and its second main terminal 42 is the source. The first power supply terminal delivers a positive DC voltage Vdd, and the second power supply terminal is ground.

If a PMOS transistor is chosen, the gate, the drain and the source of the transistor correspond to the same terminals as for an NMOS transistor, while the first power supply terminal is ground, and the second power supply terminal delivers a positive DC voltage Vdd. If an NPN transistor is chosen, the control terminal 43 of the NPN transistor is the base, its first main terminal 41 is the collector and its second main terminal 42 is the emitter. The first power supply terminal of an NPN transistor delivers a positive DC voltage Vdd, and the second power supply terminal is ground. The first power supply terminal of a PNP transistor is ground, and the second power supply terminal delivers a positive DC voltage Vdd. One skilled in the art can easily adapt the hereafter examples to alternative circuits using either a PMOS transistor, an NPN or a PNP transistor.

Transistor 40 is acting as a follower, with the input of the follower connected at the control terminal 43 and the output of the follower connected at the second main terminal 42.

However, the disadvantage of this architecture is that large component ratios are required. If $$Rc = \frac{C_4}{C_3} \text{ and } Rg = \frac{g_2}{g_1},$$

it can be shown that:

$$Rc = \frac{(Rg+1)^2(1+\tan^2\theta)}{4Rg} \quad (2)$$

which has a minimum of Rc=1+tan² θ at Rg=1.

From relation (2), it can be appreciated that this architecture is not suitable for generating complex pole pairs with high tan θ values.

Figure 3:
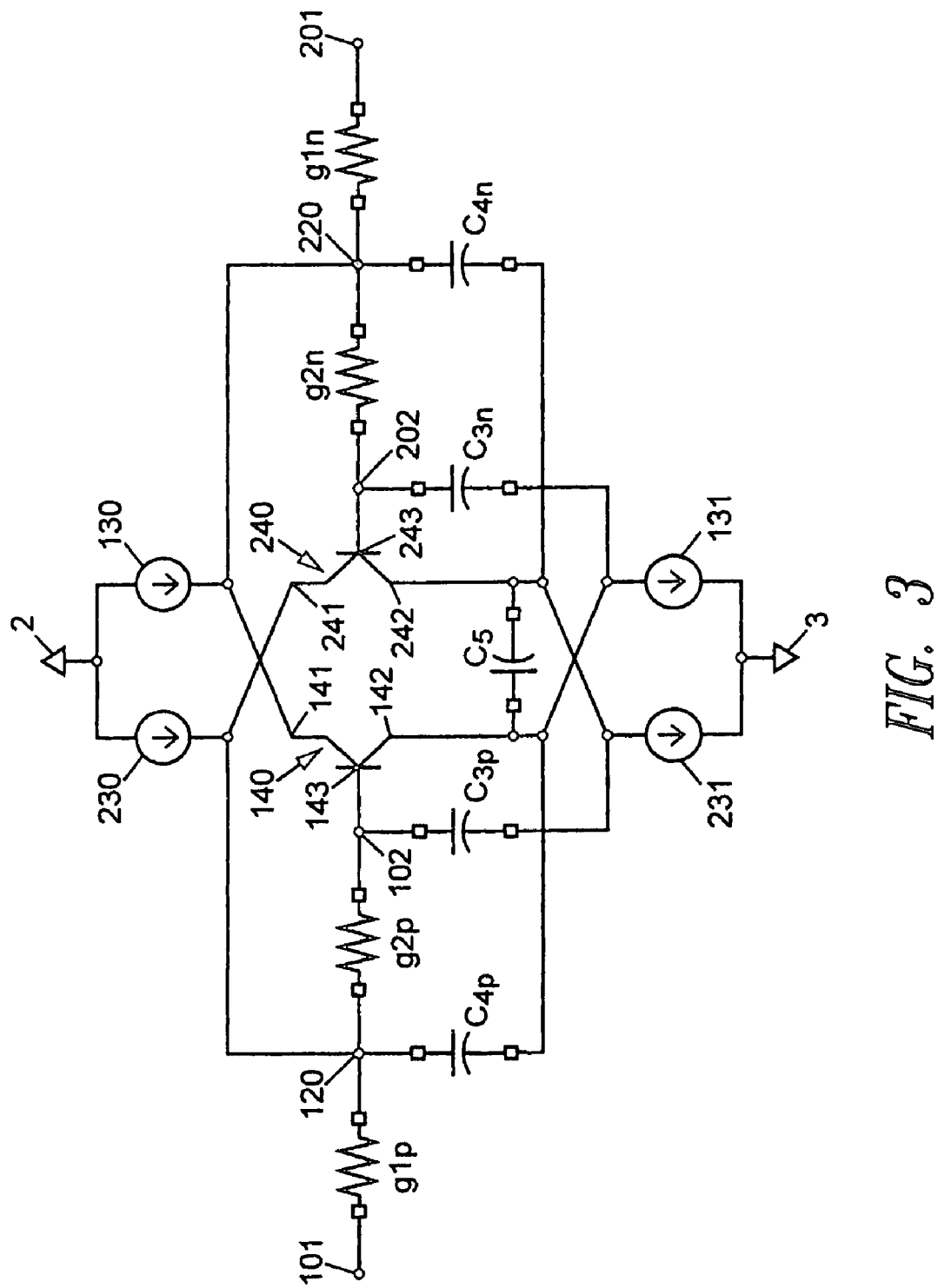
FIG. 3 is a structural circuit diagram of a differential Sallen-Key biquad circuit modified for high tan $\theta$ values.

The general architecture of the differential biquad filter presented in FIG. 3 allows such high tan θ values. The architecture is similar to the one of the modified Sallen-Key circuit shown in FIG. 2, and is completed as follows.

It further comprises a positive and a negative single ended circuit. Both single ended circuits are symmetrical and will be described hereafter. Each single ended circuit comprises a first and second power supply terminal, in this case for example the first power supply terminal delivers a positive DC voltage Vdd, and the second power supply terminal is ground.

The first single ended circuit, hereafter called the positive single ended circuit, further comprises a single input terminal 101 and a single output terminal 102. A transistor 140 is also provided, having a control terminal 143, and first main terminal 141 and a second main terminal 142. The single output terminal 102 corresponds to the control terminal 143 of the transistor 140. A first and second conductances, g1p and g2p are connected in series between the single input terminal 101 and the control terminal 143 of the transistor 140. A first current source, or DC current source, 130 is connected between the first power supply terminal 2 and the first main terminal 141 of the transistor 140 while a second current source, or DC current source, 131 is connected between the second main terminal 142 of the transistor 140 and the second power supply terminal 3. A first capacitance C3p is connected between the control terminal 143 of the transistor 140 and the second main terminal 242 of the first transistor 240 of the negative single ended circuit. A second capacitance C4p connected between the node 120 between the first and second conductances g1p and g2p on one hand, and the second main terminal 142 of the transistor 140 on the other hand. The first main terminal 141 is further connected to the node 220 between the first and second conductances g1n and g2n of the negative single ended circuit.

As the single ended circuits are symmetrical, the second single ended circuit, hereafter called the negative single ended circuit, comprises a single input terminal 201 and a single output terminal 202. A transistor 240 is also provided, having a control terminal 243, and first main terminal 241 and a second main terminal 242. The single output terminal 202 corresponds to the control terminal 243 of the transistor 240. A first and second conductances, g1n and g2n are connected in series between the single input terminal 201 and the control terminal 243 of the transistor 240. A first current source, or DC current sink, 230 is connected between the first power supply terminal 2 and the first main terminal 241 of the transistor 240, while a second current source, or DC current source 231 is connected between the second main terminal 242 of the transistor 240 and the second power supply terminal 3. A first capacitance C3n is connected between the control terminal 243 of the transistor 240 and the second main terminal 142 of the transistor 140 of the positive single ended circuit. A second capacitance C4n connected between the node 220 between the first and second conductances g1n and g2n on one hand, and the second main terminal 242 of the transistor 240 on the other hand. The first main terminal 241 is further connected to the node 120 between the first and second conductances g1p and g2n of the negative single ended circuit.

Both single ended circuits are connected to the same first and second power supply terminals, here Vdd and the ground. The differential biquad filter comprising the two single ended circuits further comprises a fifth capacitance C5 connected between the second main terminals 142 and 242 of each transistor 140 and 240 respectively.

The terminals 101 and 102 of the positive single ended circuit can also be called respectively the positive input and output terminals. The terminals 201 and 202 of the negative single ended circuit can also be called respectively the negative input and output terminals.

As other transistors will be referred to hereafter, transistors 140 and 240 are also called the main transistors of the biquad.

If Vip and Vin are respectively the potentials of the input terminal 101 and 201 of the single ended circuits, and Vop and Von respectively the potentials of the output terminals 102 and 202, the frequency response of the differential circuit of FIG. 3 is:

$$\frac{Vop - Von}{Vip - Vin} = \frac{g_1 g_2}{g_1 g_2 + 2s(g_1 C_3 - g_2 C_5) + 4s^2 C_3 C_4} \quad (3.1)$$

where g1n=g1p=g1; g2n=g2p=g2; C3n=C3p=C3; and C4n=C4p=C4, as the differential single ended circuits are symmetrical.

If $$Rc = \frac{C4}{C3}, \; Rt = \frac{C5}{C3} \text{ and } Rg = \frac{g2}{g1},$$

it can be shown that:

$$Rc = \frac{(RgRt - 1)^2 (1 + \tan^2 \theta)}{4Rg} \quad (3.2)$$

or alternatively:

$$Rg = \frac{2Rc + Rt(1 + \tan^2 \theta) - 2\sqrt{Rc^2 + RcRt(1 + \tan^2 \theta)}}{Rt^2(1 + \tan^2 \theta)} \text{ for } Rt \neq 0 \quad (3.3)$$

-continued $$Rg = \frac{1 + \tan^2 \theta}{4Rc} \text{ for } Rt = 0 \quad (3.4)$$

Assuming that |P| is the pole of the differential biquad filter, and given that $$|P|^2 = \frac{g_1 g_2}{4 C_3 C_4},$$

one obtains a second equation to calculate the component values:

$$\frac{g_1}{C_3} = 2|P|\sqrt{\frac{Rc}{Rg}} \quad (3.5)$$

Thus the component values can be found by choosing g1, Rg (and so g2) and Rt, using equation (3.2) to find Rc, and then using equation (3.5) to find C3 (and so C4 and C5). Alternatively, the component values can be found by choosing C3, Rc and Rt (and so C4 and C5), using either equation (3.3) or (3.4) to find Rg, then using equation (3.5) to find g1 (and so g2).

Rather then driving the conductances g1p and g1n with input voltage V1p and V1n respectively, a novel variation of the circuit of FIG. 3 is to inject a differential signal current using a transconductance GM driven with Vip−Vin. The transconductance converts a voltage input signal into a controlled input current signal, where the controlled input current signal produced is equal to the product of the transconductance gain (GM) by the input voltage signal applied to the transconductance. To that effect, the circuit of FIG. 3 is modified as follows. First conductances g1p from the positive single ended circuit, and g1n from the negative single ended circuit, are connected respectively in place of current sources 230 and 130, to yield the circuit of FIG. 4.

Figure 4:
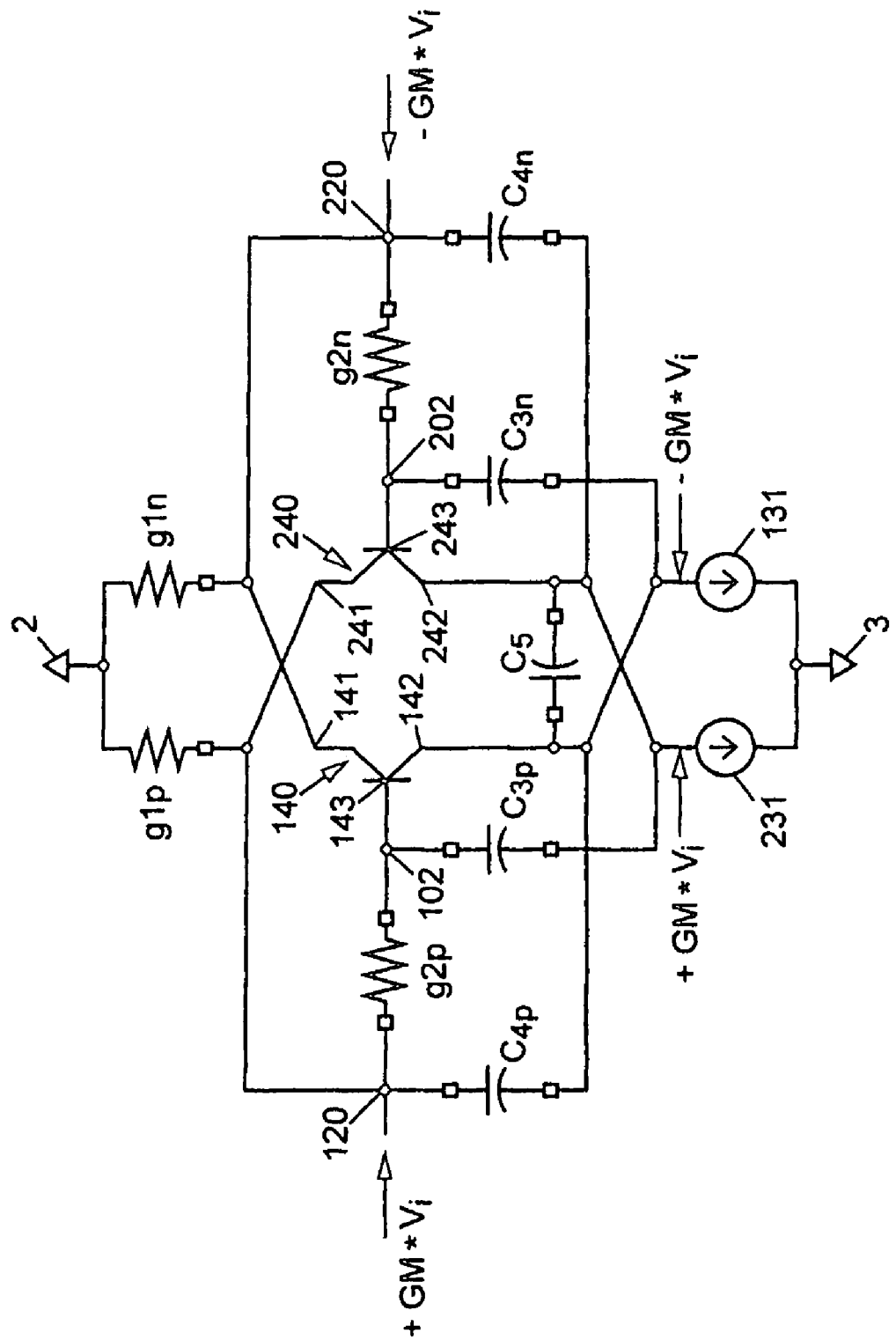
FIG. 4 is a structural circuit diagram of a biquad gain stage with high tan $\theta$ and possibility of gain according to an embodiment of the present invention.

In a first embodiment of the biquad gain stage according to the invention, input current signal Isig=GM.Vip is injected into node 120 while input current signal GM.Vin is injected into node 220 as seen in FIG. 4. In another embodiment of the biquad gain stage according to the invention, hereafter referred to as second embodiment, GM.Vip is injected into node 242 (second main terminal of transistor 240) while GM.Vin is injected into node 142 (second main terminal of transistor 140). Thus the differential input current signal Isig diff.=GM.(Vip−Vin) is injected into the circuit of FIG. 4.

In the first embodiment, an input current signal Isig=GM.Vip is injected into node 120, while an input current signal Isig=GM.Vin is injected into node 220. Biasing current sources 231 and 131 are provided in each single ended circuit to deliver biasing DC current Ibias to the biquad gain stage according to the first embodiment of the invention.

In the second embodiment, the new circuit is equivalent to first current source 231 generating a current Ibias−Isig=Ibias−GM.Vip, i.e., a biasing current to which the input current signal Isig is subtracted, and to first current source 131 generating a current Ibias+Isig=Ibias+GM.Vin, i.e., the sum of a biasing current signal and the input current signal. Biasing current sources are provided to deliver biasing DC current Ibias to each single ended circuit of the biquad gain stage according to the second embodiment of the invention.

Transconductance GM is characterized by an output current proportional to its input voltage with a small input and output admittance. Transconductance GM is connected between an input terminal and one of the nodes mentioned here before. It is in general an active component and in this case is constructed with admittance Yi and a few transistors, including NMOS transistors. Thus, thanks to a transconductance powered by Vip and Vin respectively, to generate current Isig, a gain $$\frac{GM}{g_1}$$

is implemented without influencing the pole positioning, while simultaneously allowing the elimination of the current sources 130 and 230 respectively, and their associated noise contribution. The resulting frequency response is given by equation:

$$\frac{Vop - Von}{Vip - Vin} = \frac{GM}{g_1} \frac{g_1 g_2}{g_1 g_2 + 2s(g_1 C_3 - g_2 C_5) + 4s^2 C_3 C_4} \quad (4)$$

which becomes:

$$\frac{Vop - Von}{Vip - Vin} = \frac{g_i}{g_1} \frac{g_1 g_2}{g_1 g_2 + 2s(g_1 C_3 - g_2 C_5) + 4s^2 C_3 C_4} \quad (4')$$

with the hypothesis that GM is dominated essentially by admittance Yi, here a conductance gi.

Varying GM, using for example well know techniques such as switching conductances, varying bias currents or cross-coupling differential signals, allows the DC gain $$\frac{GM}{g_1}$$

to be controlled without influencing the pole positioning.

Figure 5:
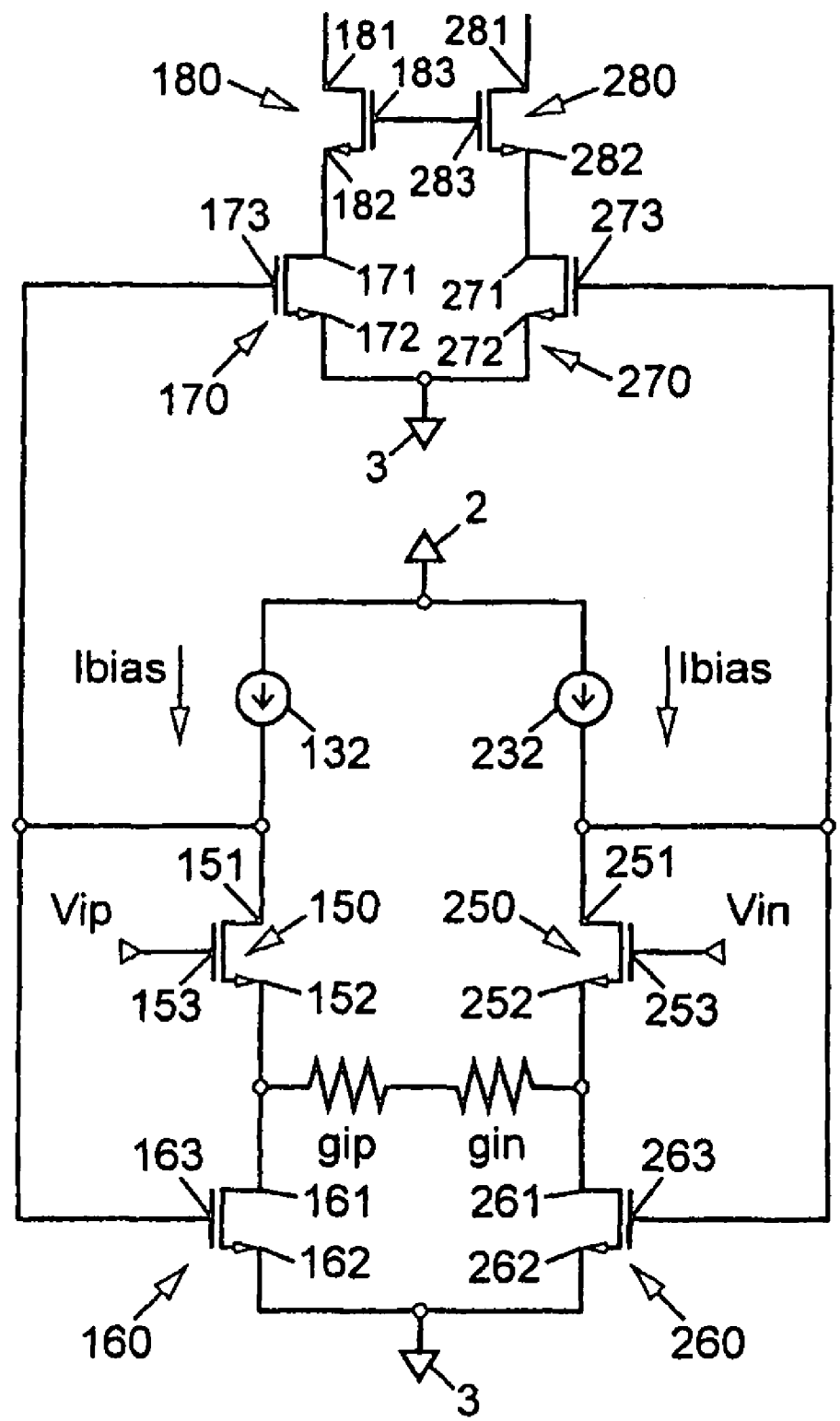
FIG. 5 is a structural circuit diagram of an example of transconductance circuit used in the biquad gain stage according to an embodiment of the present invention.

An example of a transconductance circuit is shown in FIG. 5 and will be described later on. The simplest type of transconductance known is as a "differential pair transconductance." With an NMOS differential pair, the total transconductance is given by GM=$gm_{NMOS}$ (where $gm_{NMOS}$ is the NMOS transconductance). If such a differential pair is used to inject current into the biquad gain stage of FIG. 4, the DC gain of equation (4) becomes:

$$\frac{gm_{NMOS}}{g_1}$$

Thus the biquad gain stage according to some embodiments of the invention, preceded by a transconductance GM, will both provide gain and filtering.

Analysis of all biquads have so far assumed an ideal follower transistor, i.e., for FIG. 3, that $V_{102}-V_{202}=V_{142}-V_{242}$ for follower transistors 140 and 240. The circuit's limitations can be understood by taking into account the NMOS (or NPN if bipolar transistors are chosen for transistors 140 and 240) follower's finite transconductance term gmN.

As unity gain is desired for the follower transistors 140 and 240, a local bulk source connection means that these followers' bulk-source trans-conductance $gmbs_N$ can be ignored. As a result equation (4) becomes:

$$\frac{Vop - Von}{Vip - Vin} = \left[\frac{GM}{g_1}\right] \frac{\left[g_1 g_2 + s\left[\frac{g_1(g_1+g_2)C_3 - g_2 C_4}{gm_N}\right] + s^2\left[\frac{g_1 C_3 C_4}{gm_N}\right]\right]}{\begin{bmatrix} g_1 g_2 + \\ s\left[2(g_1 C_3 - g_2 C_5) + \frac{g_1 g_2(C_3 + C_4 + 2C_5)}{gm_N}\right] + \\ s^3\left[\frac{2C_3 C_4 C_5}{gm_N}\right] + \\ s^2\left[4C_3 C_4 + \right. \\ \left. \frac{C_3 C_4(g_1 + 4g_2) + 2C_5(g_2 C_4 + (g_1 + g_2)C_3)}{gm_N}\right] \end{bmatrix}} \quad (5)$$

It can be seen from (5) that $gm_N$ needs to be large enough to render the parasitic $1/gm_N$ terms negligible within the frequency band of interest.

Figure 6:
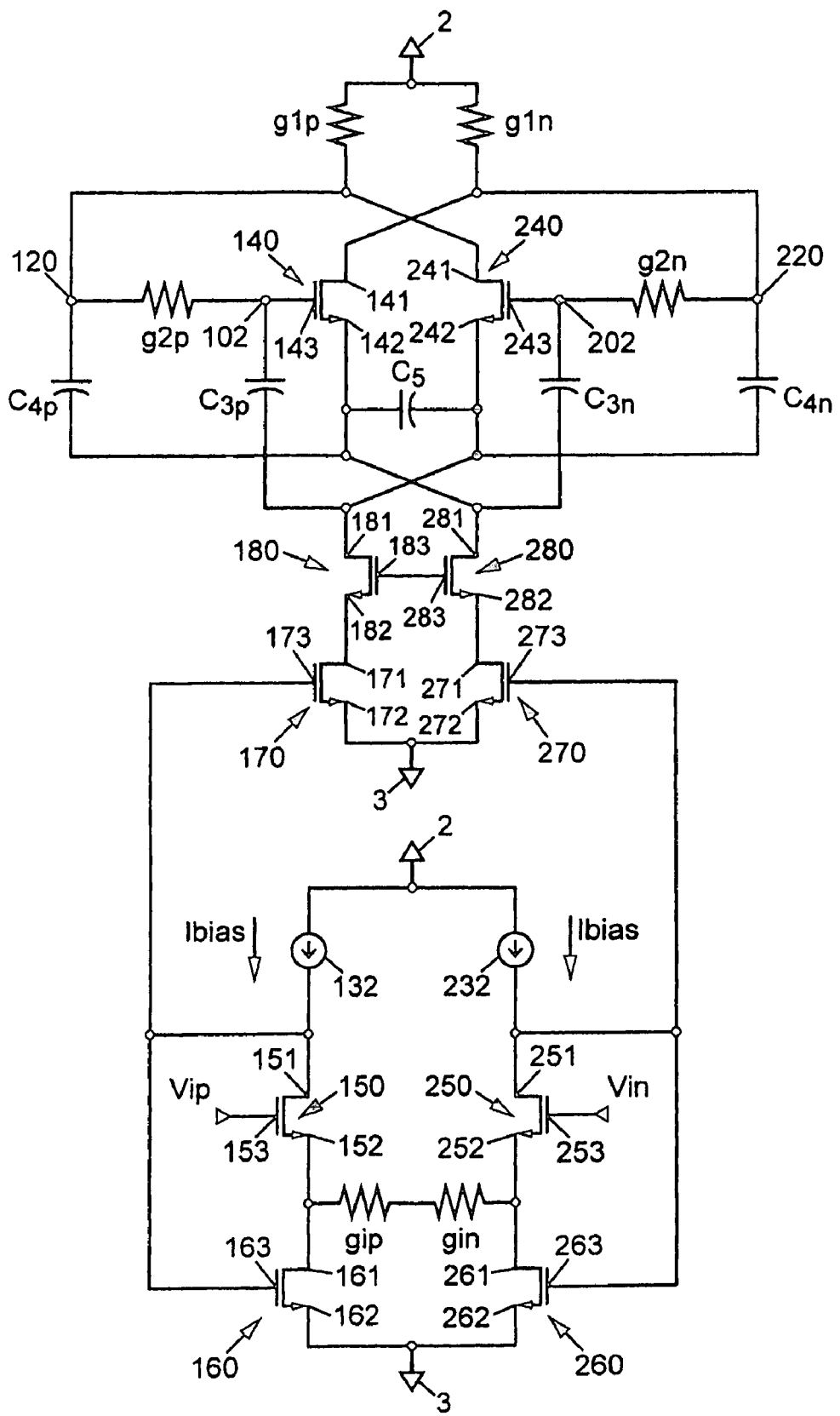
FIG. 6 is a structural circuit diagram of the complete biquad gain stage according an embodiment of the present invention.

DC current sinks generating Ibias in the first embodiment may generate noise. In order to reduce such noise, in a preferred non-limiting implementation of the invention, first current source 231 generates a current Ibias−Isig while first current source 131 generates a current Ibias+Isig thanks to the exemplary GM circuit of FIG. 5. The resulting biquad gain stage is shown in FIG. 6 and described later on.

To generate Ibias−Isig, and Ibias+Isig respectively, transconductance GM that is a differential circuit comprising a positive and a negative single ended circuits, each of which including a biasing current source generating a current Ibias. Both single ended circuit are symmetrical and will be described hereafter. They respectively correspond to the current sources 231 and 131. Each single ended circuit comprises a first 2 and second 3 power supply terminals, in this case for example the first power supply terminal delivers a positive DC voltage Vdd, and the second power supply terminal is ground. First and second power supply terminals 2 and 3 correspond to the terminals of the circuit shown in FIG. 4, and are hence given the same numbers.

The first single ended circuit, hereafter called the positive single ended circuit of the GM circuit, comprises a DC current source 132 that delivers bias current Ibias, and a first transistor 150, having a control terminal 153, and a first main terminal 151 and a second main terminal 152. DC current source 132 is connected between the first power supply terminal 2 and the first main terminal 151. A second transistor 160, having a control terminal 163, and a first main terminal 161 and a second main terminal 162, is also provided on the GM circuit. Its second main terminal 162 is connected to the second power supply terminal 3, while the first main terminal 161 and its control terminal 163 are respectively connected to the second main terminal 152 and the first main terminal 151 of transistor 150. A third transistor 170, having a control terminal 173, and a first main terminal 171 and a second main terminal 172, and a fourth transistor 180, having a control terminal 183, and a first main terminal 181 and a second main terminal 182, are further provided on the GM circuit. The second main terminal 172 and the control terminal 173 of transistor 170 are respectively connected to the second power supply terminal 3 and the control terminal 163 of transistor 160. The first main terminal 171 of transistor 170 is connected to the second main terminal 182 of transistor 180.

As the single ended circuits of the GM circuit are symmetrical, the second single ended circuit, hereafter called the negative single ended circuit, comprises a DC current source that delivers current Ibias, and a first transistor 250, having a control terminal 253, and a first main terminal 251 and a second main terminal 252. DC current source 232 is connected between the first power supply terminal 2 and the first main terminal 251. A second transistor 260, having a control terminal 263, and a first main terminal 261 and a second main terminal 262, is also provided on the GM circuit. Its second main terminal 262 is connected to the second power supply terminal 3, while its first main terminal 261 and its control terminal 263 is respectively connected to the second main terminal 252 and the first main terminal 251 of transistor 250. A third transistor 270, having a control terminal 273, and a first main terminal 271 and a second main terminal 272, and a fourth transistor 280, having a control terminal 283, and a first main terminal 281 and a second main terminal 282, are further provided on the GM circuit. The second main terminal 272 and the control terminal 273 of transistor 270 are respectively connected to the second power supply terminal 3 and the control terminal 263 of transistor 260. The first main terminal 271 of transistor 270 is connected to the second main terminal 282 of transistor 280.

In the example of FIG. 5, both single ended circuits are connected to the same first and second power supply terminals, Vdd and the ground. The differential transconductance circuit further comprises two conductances gip and gin connected in series between the second main terminals 152 and 252 of each transistor 150 and 250 respectively.

Furthermore, the control terminals 183 and 283 of transistor 180 and 280 are connected to each other.

The differential input voltages Vip and Vin are applied to the control terminals the 153 and 253 of transistor 150 and 250 respectively.

Though a differential pair could have been used (to replace current sinks 231 and 131), the GM circuit has been chosen for its use of a feedback loop to achieve an accurate gain and good linearity. Intuitively the current sources 132 and 232 ensure that the currents through the input transistors 150 and 250 respectively are constant so that these transistors behave as followers.

Transconductance GM is connected to the circuit of FIG. 4 by connecting the circuit of FIG. 4 with transistors 180 and 170, i.e., the first main terminal 181 of transistor 180 being connected to the second main terminal 242 of transistor 240, and with transistors 280 and 270, i.e., the first main terminal 281 of transistor 280 being connected to the second main terminal 142 of transistor 140.

Thus the differential input voltage Vip-Vin applied to the control terminals 153 and 253 of transistors 150 and 150 respectively is also seen across the input conductances gip and gin, generating a signal current Isig=gi.(Vip−Vin)/2, provided gi=gip=gin.

Consequently, the current through transistor 160 is equal to Ibias−Isig, which corresponds to the current source 231 of the second embodiment, while the current through transistor 260 is equal to Ibias+Isig, which corresponds to the current source 131 of the second embodiment. Transistors 170 and 270 mirror the currents through 160 and 260 respectively, such that the differential output signal current is equal to $$I_{sig} = \frac{gm_3}{gm_2},$$

with gm3 being the finite transconductance term of transistor 170, while gm2 is the finite trans-conductance term of transistor 160. Current through transistor 170 is equal to $$\frac{gm_3}{gm_2}(I_{bias} - I_{sig}),$$

while current through transistor 270 is $$\frac{gm_3}{gm_2}(I_{bias} + I_{sig})$$

A more rigorous loop analysis shows that the loop gain LG is given by:

$$LG = \left( \frac{gm_2}{Y_{mir} + \frac{gds_1 Y_i}{gm_1 + gmbs_1 + gds_1 + Y_i}} \right) \frac{gm_1 + gmbs_1 + gds_1}{gm_1 + gmbs_1 + gds_1 + Y_i} \quad (6.1)$$

with: gm1 the finite transconductance term of transistors 150 and 250, gds1 their drain-source conductance, gmbs1 their bulk-source trans-conductance, Yi the admittance between the second main terminal of either transistor 150 or 250 and AC differential ground (largely dominated by the admittance connecting the second main terminal of transistor 150 to the second main terminal of transistor 250), Ymir the admittance between the control terminal of either transistor 160 or 260 and AC differential ground.

The DC loop gain may be approximated by:

$$LG_{DC} \approx \left( \frac{gm_2}{g_{mir}} \right) \frac{gm_1 + gmbs_1}{gm_1 + gmbs_1 + g_i} \quad (6.2)$$

while the dominant pole $P_L$ and non dominant pole $P_H$ can be approximated by:

$$P_L \approx \frac{g_{mir}}{C_{mir}} \text{ and } P_H \approx \frac{gm_1 + gmbs_1 + g_i}{C_i}$$

gi and Ci being respectively the conductance and capacitance of Yi, while gmir and Cmir being respectively the conductance and capacitance of Ymir.

Further analysis shows that the total transconductance GM is given by $$GM \approx \left(\frac{gm_3}{gm_2}\right)\left(\frac{LG}{1+LG}\right)\frac{gm_1}{gm_1+gmbs_1+gds_1}Y_i. \quad (6.3)$$

It can be seen from (6.3) that it is preferable to have a local bulk connection for the transistors 150 and 250, thus making gmbs1=0.

Provided gmbs1=0, LG>>1, gm1>>gds1, and if the admittance Yi is dominated by the conductances gip and gin, then it can be seen that the GM circuit of FIG. 5 provides a linear transconductance proportional to the conductances gip and gin. If in addition these conductances are of the same type as the biquad conductances, then (6.3) becomes (6.3'):

$$GM \approx \frac{gm_3}{gm_2}g_i \quad (6.3')$$

and the overall GM-biquad frequency response can have an accurate DC gain as shown below:

$$\frac{Vop-Von}{Vip-Vin} = \left(\frac{gm_3}{gm_2}\right)\left(\frac{g_i}{g_1}\right)\frac{g_1g_2}{g_1g_2+2s(g_1C_3-g_2C_5)+4s^2C_3C_4} \quad (7)$$

With Vop-Von the differential output voltage read across nodes 102 and 202, which correspond to the control terminals 143 and 243 of main transistors 140 and 240 respectively.

A pure gain stage (with no filtering and tan θ=0) could be timplemented by simply shorting conductance g2 and removing the capacitances C3, C4 and C5 such that:

$$\frac{Vop-Von}{Vip-Vin} = \left(\frac{gm_3}{gm_2}\right)\left(\frac{g_i}{g_1}\right) \quad (8)$$

Figure 7:
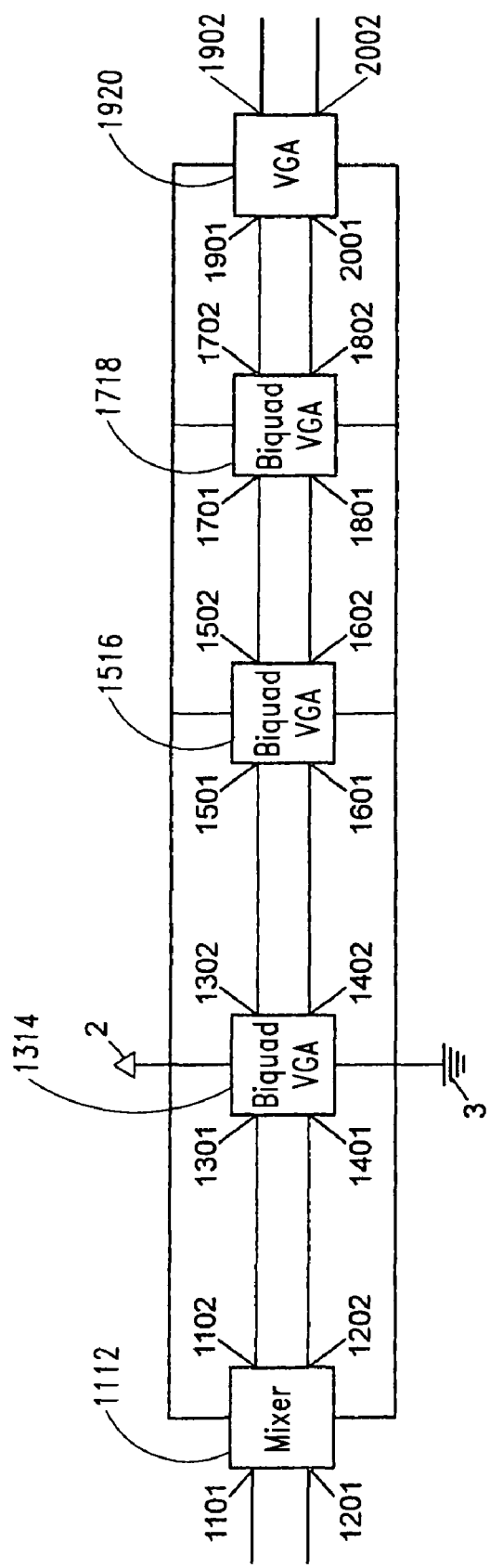
FIG. 7 is a structural circuit diagram of the Variable Gain Amplifier filter according to an embodiment of the invention.

A non-limiting example of a VGA filter according to the invention, with cascaded biquad gain stages, is presented in FIG. 7. As the chosen architecture of the embodiment allows a distribution of the gain and filtering along a signal chain comprising a series of low-noise, high-Q biquad gain stages, the VGA filter comprises more precisely 4 gain stages (a mixer stage and 3 biquad gain stages), followed by a pure gain stage (no filtering). A mixer stage can consist of a well known Gilbert current multiplier loaded with a conductance and capacitance in order to produce an RF to base-band gain and a single real base-band pole. In an exemplary implementation of the invention, which corresponds to the values of table 1 here below, each stage provides a gain of 12 dB. The pole positions (magnitude in MHz, tan θ, and Q factor) are also given in Table 1.

TABLE 1

|  | Pole Magnitude | tanθ | $Q = \sqrt{\frac{1+\tan^2\theta}{4}}$ | Maximum gain |
| --- | --- | --- | --- | --- |
| mixer | 283 MHz | 0 | 0.500 | 12 dB |
| first biquad | 283 MHz | 0.4816 | 0.555 | 12 dB |
| second biquad | 283 MHz | 1.254 | 0.802 | 12 dB |
| third biquad | 283 MHz | 4.381 | 2.247 | 12 dB |
| pure gain stage | — | — |  | 12 dB |

The VGA filter comprises first and second power supply terminals 2, 3, and further comprises a positive input terminal 1101 and a negative input terminal 1201, a positive output terminal 1902 and a negative output terminal 2002. The VGA filter also comprises a plurality of biquad gain stages of the type described here above in respect to FIG. 5. In FIG. 7, there are four biquad gain stages cascaded together each as in FIG. 6, preceded by a mixer stage and numbered respectively 1112, 1314, 1516, 1718, and 1920. The differential stages are powered between the first and second power supply terminals 2 and 3.

The plurality of stages are linked in series with each other. Buffers are required between each stage to isolate the output of the previous biquad from the input of the next. This is common practice for biquads as the buffers are used to isolate the poles of each biquad from outside interference. With one mixer stage (a single real pole), 3 biquad stages (2 poles) and one gain stage (no pole), the exemplary VGA filter of FIG. 7 is a 7th order filter with 5 buffers.

Through the buffers, the positive and negative output voltage of one stage (except for the last one) correspond to the positive and negative input voltages of a subsequent stage. Permutations can also be implemented as the positive output voltage of a stage could be applied to the negative input voltage of the following stage (effectively multiplying the transfer function by −1), and the negative output voltage of the latter could be applied to the positive input voltage of a third stage (again multiplying the transfer function by −1), resulting in no change in the total transfer function (−1*−1=1).

In the example of FIG. 7, the buffers are not represented. All biquad gain stages comprise a pair of input terminals (positive and negative, driven respectively by the positive and negative input voltages), and a pair of output terminals (positive and negative, from which the positive and negative output voltages are respectively driven).

Mixer 1112 comprises positive and negative input terminals 1101 and 1201 respectively, and positive and negative output terminals 1102 and 1202 respectively. First differential biquad 1314 comprises positive and negative input terminals 1301 and 1401 respectively, and positive and negative output terminals 1302 and 1402 respectively. Second differential biquad 1516 comprises positive and negative input terminals 1501 and 1601 respectively, and positive and negative output terminals 1502 and 1602 respectively. Third differential biquad 1718 comprises positive and negative input terminals 1701 and 1801 respectively, and positive and negative output terminals 1702 and 1802 respectively. Pure gain stage 1920 comprises positive and negative input terminals 1901 and 2001 respectively, and positive and negative output terminals 1902 and 2002 respectively.

In order to connect the five stages 1112, 1314, 1516, 1718, and 1920 in series, output terminals 1102 and 1202 are linked to the input terminals 1301 and 1401 respectively, output terminals 1302 and 1402 are linked to the input terminals 1501 and 1601 respectively, output terminals 1502 and 1602 are linked to the input terminals 1701 and 1801 respectively, and output terminals 1702 and 1802 are linked to the input terminals 1901 and 2001 respectively. In this example, a positive output terminal is linked to a positive input terminal, while a negative output terminal is linked to a negative input terminal.

The positive and negative input terminals of the whole VGA lowpass filter correspond respectively to the positive and negative input terminals of the first, of the plurality of elementary differential biquad gain stages while the positive and negative output terminals correspond respectively to the positive and negative output terminals of the last of the plurality of differential biquad circuits. As mentioned before permutation can be used while linking the positive and negative terminals together.

An exemplary, non-limiting response of a VGA filter according to the present invention, with a mixer, 3 biquads gain stage, and a pure gain stage, is plotted in FIGS. 8.1 and 8.2. FIG. 8.1 corresponds to the frequency response while FIG. 8.2 corresponds to the gain.

The displayed results actually correspond to a VGA filter for which the first real pole and gain stage have been incorporated into the mixer where the gain is given by:

$$\text{Gain} = \frac{GM_{mix}}{g_{mix}}$$

and the pole is given by:

$$P = \frac{g_{mix}}{C_{mix}}$$

with $GM_{mix}$ is the mixer RF to base-band transconductance and $g_{mix}+sC_{mix}$ is the mixer output admittance.

In this case, gain control is achieved by tapping off various outputs of an R2R resistor network that loads the current mixer. Alternatively, the gain control could have been distributed along the chain forming the VGA filter by switching in and out conductance in the transconductance to vary gi. A finer gain control is placed at the end of the signal chain to adjust for small variations in the input signal magnitude.

The differential circuits described above use NMOS transistors, but can alternatively be replaced by PMOS transistors, by inverting the two first and second power supply terminals. When NMOS transistors are used in the transconductance circuit GM, a NPN transistor may be used for the main transistors 140 and 240. One skilled in the art can easily adapt the here before architecture to alternative circuits using either PMOS transistors only, or PMOS transistors for the GM circuit and PNP transistors for the main transistors 140 and 240.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A differential biquad filter gain stage comprising:
   a positive single ended circuit and a negative single ended circuit, each including:
      first and second power supply terminals;
      a main transistor having a control terminal, and first and second main terminals;
      a single output terminal coupled to the control terminal of said main transistor;
      first and second conductances coupled between the first power supply terminal and the control terminal of the main transistor;
      a first capacitor coupled between the control terminal of said main transistor and the second main terminal of the main transistor of the other single ended circuit;
      a second capacitor coupled between a node between said first and second conductances and the second main terminal of said main transistor, the first main terminal of said main transistor being further coupled to a node between said first and second conductances of the other single ended circuit; and
      a first biasing current source operatively coupled to the other single ended circuit to bias said other single ended circuit; and
   a polarity capacitor having first and second terminals, the first terminal of the polarity capacitor being coupled to the second main terminal of the main transistor of the positive single ended circuit and the second terminal of the polarity capacitor being coupled to the second main terminal of the main transistor of the negative single ended circuit.

2. The differential biquad filter gain stage of claim 1 further comprising:
   a transconductance configured to produce an input current signal when having an input voltage applied thereto, wherein the node between the first and second conductances is configured to receive the input current signal.

3. The differential biquad filter gain stage of claim 1 further comprising:
   a transconductance configured to produce an input current signal when having an input voltage applied thereto, wherein the second main terminal of the main transistor of the other single ended circuit is configured to receive the input current signal.

4. A differential biquad filter gain stage according to claim 2 wherein for each single ended circuit, the biasing current source is coupled between the second main terminal of the main transistor of the other single ended circuit, and the second power supply terminal.

5. A differential biquad filter gain stage according to claim 3 wherein the transconductance comprises a positive and a negative single ended circuit, corresponding respectively to the positive and negative single ended circuit of said differential biquad filter gain stage, each of said single ended circuit of said transconductance further comprising:
   a first transistor having a control terminal, and first and second main terminals;
   a second transistor having a control terminal, and first and second main terminals;
   a third transistor having a control terminal, and first and second main terminals;
   a fourth transistor having a control terminal, and first and second main terminals;
   a second biasing current source coupled between the first power supply terminal and the first main terminal of the first transistor, the second main terminal of said first transistor being coupled to the first main terminal of the second transistor, said second main terminal of said second transistor being coupled to the second power supply terminal, the control terminal of said second transistor being coupled to said first main terminal of said first transistor and to the control terminal of the said third transistor, the first main terminal of said third transistor being coupled to the second main terminal of the fourth transistor, the second main terminal of said third transistor being coupled to the second power supply terminal, the first main terminal of said fourth transistor being coupled to the second main terminal of the main transistor of the other single ended circuit;
   the input voltage being applied to the control terminal of the first transistor;
   the differential biquad filter gain stage further comprising:

third and fourth conductances coupled between the second main terminal of the first transistor of each first current source, the respective control terminal of the fourth transistor of each single ended circuit being coupled to each other.

6. A differential biquad filter gain stage according to claim 5 wherein both main transistors of the positive and negative single ended circuits are identical NPN or NMOS transistors, and all transistors of the transconductance are NMOS transistors.

7. A differential biquad filter gain stage according to claim 5 wherein both main transistors of the positive and negative single ended circuits are identical PNP or PMOS transistors, and all transistors of the transconductance are PMOS transistors.

8. A lowpass filter comprising:
first and second power supply terminals;
a positive input terminal and a negative input terminal;
a positive output terminal and a negative output terminal;
a plurality of differential biquad filter gain stages powered between the first and second power supply terminals, each differential biquad filter gain stage including:
  a positive single ended circuit and a negative single ended circuit, wherein each positive and negative single ended circuit includes:
    first and second power supply terminals;
    a main transistor having a control terminal, and first and second main terminals;
    a single output terminal coupled to the control terminal of said main transistor;
    first and second conductances coupled between the first power supply terminal and the control terminal of the main transistor;
    a first capacitor coupled between the control terminal of said main transistor and the second main terminal of the main transistor of the other single ended circuit;
    a second capacitor coupled between a node between said first and second conductances and the second main terminal of said main transistor, the first main terminal of said main transistor being further coupled to a node between said first and second conductances of the other single ended circuit; and
    a first biasing current source operatively coupled to the other single ended circuit to bias said other single ended circuit; and
  a polarity capacitor having first and second terminals, the first terminal of the polarity capacitor being coupled to the second main terminal of the main transistor of the positive single ended circuit and the second terminal of the polarity capacitor being coupled to the second main terminal of the main transistor of the negative single ended circuit;
  wherein an input signal current is injected either into the node between the first and second conductances, or into the second main terminal of the main transistor of the other single ended circuit, the input current signal being produced by an input voltage applied to a transconductance;
wherein the plurality of differential biquad filter gain stages are coupled in series with each other; and,
wherein the positive and negative input terminals correspond to the input terminals of the first of the plurality of differential biquad filter gain stages, while the positive and negative output terminals correspond to the output terminals of the last of said plurality of differential biquad filter gain stages.

9. A lowpass filter according to claim 8 wherein each the main transistor of each differential biquad filter gain stages further comprises a differential transconductance circuit.

10. A lowpass filter according to claim 9 wherein each differential transconductance circuit further comprises:
a third single ended circuit differentially coupled to the first single ended circuit and a fourth single ended circuit differentially coupled to the second single ended circuit, each of said third and fourth single ended circuits comprising:
  a second biasing current source
  a second transistor having a control terminal, and first and second main terminals;
  a third transistor having a control terminal, and first and second main terminals;
  a fourth transistor having a control terminal, and first and second main terminals;
  a fifth transistor having a control terminal, and first and second main terminals; and
  a third conductance.

11. A lowpass filter according to claim 9 wherein the main transistor of each ended circuits are identical NPN or NMOS transistors, and all transistors of the transconductance are NMOS transistors.

12. A differential biquad filter gain stage comprising:
a first capacitor;
a first single ended circuit; and
a second single ended circuit, wherein the first capacitor is a polarity capacitor positioned between the single ended circuits and each single ended circuit includes:
  a plurality of power supply terminals;
  a main transistor including a control terminal, a first main terminal, and a second main terminal;
  a single output terminal coupled to the control terminal of the main transistor;
  a first conductance and a second conductance coupled together, wherein each conductance includes first and second terminals;
  a second capacitor coupled to the first and second conductances, wherein the second capacitor includes first and second terminals; and
  a third capacitor coupled to the control terminal of the main transistor, wherein the third capacitor includes first and second terminals.

13. A differential biquad filter gain stage according to claim 12 wherein the first single ended circuit is a positive single ended circuit and the second single ended circuit is a negative single ended circuit.

14. A differential biquad filter gain stage according to claim 12 wherein in each single ended circuit:
the second terminal of the first conductance is coupled to the first terminal of the second conductance;
the second terminal of the second conductance is coupled to the single output terminal;
the first terminal of the second capacitor is coupled to a node between the first and the second conductances; and
the second terminal of the second capacitor is coupled to the second main terminal of the main transistor, the first main terminal of the main transistor being further coupled to a node between the first and second conductances of the other single ended circuit.

15. A differential biquad filter gain stage according to claim 12 wherein in each single ended circuit:
the first terminal of the third capacitor is coupled to the control terminal of the main transistor;

a node between the first and second conductances of each single ended circuit is coupled to the first main terminal of the main transistor of the other single ended circuit; and the second terminal of the third capacitor is coupled to the second terminal of the second capacitor of the other single ended circuit.

16. A differential biquad filter gain stage according to claim 12 wherein the first terminal of the first capacitor is coupled to the second main terminal of the main transistor of the first single ended circuit and the second terminal of the first capacitance is coupled to the second main terminal of the main transistor of the second single ended circuit.

17. A differential biquad filter gain stage according to claim 12, further comprising a biasing current source wherein the biasing current source is coupled to the second terminal of the second capacitor and further coupled to one of the plurality of power supply terminals.

18. A differential biquad filter gain stage according to claim 12 further comprising a single input terminal wherein the single input terminal is coupled to the first terminal of the first conductance.

19. A differential biquad filter gain stage according to claim 12 further comprising a single input terminal coupled to the second terminal of the second capacitor.

20. A differential biquad filter gain stage according to claim 12 further comprising a single input terminal coupled to a node between the first and second conductances and the first terminal of the first conductance is coupled to one of the plurality of power supply terminals.

21. A differential biquad filter gain stage according to claim 12 further comprising a single input terminal wherein each single ended circuit is operable to accept an input current signal injected into the single input terminal, said input current signal produced by an input voltage applied to a transconductance.

22. A differential biquad filter gain stage according to claim 12 wherein each single ended circuit further comprises a biasing current source, said biasing current source operable to bias the other single ended circuit.

23. A differential transconductance biquad filter gain stage comprising:
a differential biquad filter gain stage including a first single ended circuit and a second single ended circuit, wherein each single ended circuit has a first transistor and wherein a main terminal of the first transistor of the first single ended circuit is coupled via a polarity capacitor to a main terminal of the first transistor of the second single ended circuit;
a third single ended circuit differentially coupled to the first single ended circuit; and
a fourth single ended circuit differentially coupled to the second single ended circuit;
wherein each of said third and fourth single ended circuits includes:
second, third, fourth, and fifth transistors each including a control terminal, a first main terminal, and a second main terminal;
a biasing current source; and
a conductance including first and second terminals;
wherein the conductance of the third single ended circuit is coupled in series with the conductance of the fourth single ended circuit.

24. A differential transconductance biquad filter gain stage according to claim 23 wherein:
a single input terminal is coupled to the control terminal of the fourth transistor;

the second main terminal of the second transistor is coupled to the first main terminal of the third transistor;
the second main terminal of the third transistor is coupled to one of a plurality of power supply terminals;
the control main terminal of the third transistor is coupled to the first main terminal of the fourth transistor and to the control terminal of the fifth transistor;
the second main terminal of the fourth transistor is coupled to the first main terminal of the fifth transistor;
the second main terminal of the fifth transistor is coupled to one of the plurality of power supply terminals; and
the first terminal of the conductance is coupled to a node between the second main terminal of the fourth transistor and the first main terminal of the fifth transistor.

25. A differential transconductance biquad filter gain stage according to claim 23 wherein:
the control terminal of the second transistor of the third and fourth single ended circuits are coupled together; and
the biasing current source is coupled to the first main terminal of the fourth transistor and further coupled to one of the plurality of power supply terminals.

26. A lowpass filter comprising:
a plurality of differential transconductance biquad filter gain stages, each including:
a differential biquad filter gain stage including a first single ended circuit and a second single ended circuit wherein a polarity capacitor is coupled between the first and second single ended circuits, the polarity capacitor having a first terminal coupled to the first single ended circuit and the polarity capacitor having a second terminal coupled to the second single ended circuit;
a third single ended circuit differentially coupled to the first single ended circuit;
and a fourth single ended circuit differentially coupled to the second single ended circuit;
wherein the third single ended circuit and the fourth single ended circuit each include a conductance and said conductances of the third and fourth single ended circuits are coupled in series.

27. A lowpass filter according to claim 26 wherein the lowpass filter further comprises:
a positive input terminal and a negative input terminal; and
a positive output terminal and a negative output terminal;
wherein the differential transconductance biquad filter gain stages are coupled in series.

28. A method of filtering large blockers and amplifying small wide-band signals in a lowpass filter, the method comprising the steps of:
injecting small wide-band positive and negative input signals into the lowpass filter;
distributing the small wide-band positive and negative input signals along a plurality of biquad filter gain stages;
differentially amplifying the small wide-band positive and negative input signals with low noise in a first biquad filter gain stage;
differentially filtering large blockers from positive and negative input signals with high Q in the first biquad filter gain stage, said high O provided in part by coupling a positive single ended circuit to a negative single ended circuit via a polarity capacitor;
passing filtered and amplified small wide-band positive and negative signals from the first biquad filter gain stage to a subsequent biquad filter gain stage;
differentially amplifying the small wide-band positive and negative signals with low noise in the subsequent biquad filter gain stage; and differentially filtering large blockers from the small wide-band positive and negative signals with high Q in subsequent biquad filter gain stage.

29. The method of claim 28 further comprising the steps of:
receiving the small wide-band positive and negative input signals in a mixer stage of the lowpass filter;
mixing the small wide-band positive and negative input signals; and
passing the mixed wide-band positive and negative input signals to the first biquad filter gain stage.

30. The method of claim 28 further comprising the steps of:
accepting the small wide-band positive and negative signals from the subsequent biquad filter gain stage into a pure gain stage of the lowpass filter;
amplifying the small wide-band positive and negative signals; and
passing amplified wide-band positive and negative signals from the low pass filter.

31. The differential biquad filter gain stage of claim 12 wherein the first capacitor includes first and second terminals, the first terminal of the first capacitor coupled to the second main terminal of the main transistor of the first single ended circuit and the second terminal of the first capacitor coupled to the second main terminal of the main transistor of the second single ended circuit.

* * * * *